ary Examiner—Won H. Louie, Jr.

United States Patent [19]

Nagashima et al.

[11] 4,258,123
[45] Mar. 24, 1981

[54] PHOTOSENSITIVE RESIN COMPOSITION

[75] Inventors: Akira Nagashima, Shizuoka; Shigeru Sato, Odawara, both of Japan

[73] Assignee: Fuji Photo Film Co., Ltd., Minami-ashigara, Japan

[21] Appl. No.: 70,556

[22] Filed: Aug. 29, 1979

[30] Foreign Application Priority Data

Aug. 29, 1978 [JP] Japan .................. 53-105196

[51] Int. Cl.³ .................. G03C 1/68
[52] U.S. Cl. .................. 430/281; 430/283; 430/284; 430/285; 430/286; 430/343; 430/344; 430/916; 430/920; 430/925; 430/292
[58] Field of Search .......... 430/916, 920, 925, 343, 430/344, 281, 283, 285, 284, 286, 292, 287, 288

[56] References Cited

U.S. PATENT DOCUMENTS

| 3,527,639 | 9/1970 | Moraw | 430/344 |
|---|---|---|---|
| 3,640,718 | 2/1972 | Smith | 430/925 |
| 3,769,023 | 10/1973 | Lewis | 430/925 |
| 3,775,123 | 11/1973 | Takano et al. | 430/344 |
| 3,870,524 | 3/1975 | Watanabe et al. | 430/920 |
| 3,954,475 | 5/1976 | Bonham et al. | 430/925 |
| 4,058,398 | 11/1977 | Osada et al. | 430/920 |
| 4,058,443 | 11/1977 | Murata et al. | 430/920 |

Primary Examiner—Won H. Louie, Jr.
Attorney, Agent, or Firm—Sughrue, Rothwell, Mion, Zinn and Macpeak

[57] ABSTRACT

A photosensitive resin composition comprising:

(a) a photopolymerizable or photocrosslinkable ethylenically unsaturated compound;
(b) a compound of the formula (I):

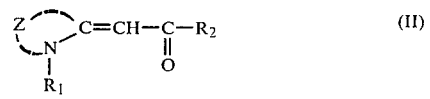

wherein $X_1$, $X_2$ and $X_3$ may be the same or different and each represents a hydrogen atom, a chlorine atom or a bromine atom and at least one of $X_1$, $X_2$ and $X_3$ representing a chlorine atom or a bromine atom; Y represents a $-CX_1X_2X_3$ group where $X_1$, $X_2$ and $X_3$ are as defined above, $-NH_2$, $-NHR'$, $-NR'_2$, $-SR'$, $-OR'$ or $-R'$ wherein $R'$ is an alkyl group or an aryl group; R is an alkyl group, an aryl group or an alkenyl group, and may be substituted;

(c) a compound of the formula (II):

$$Z \underset{\underset{R_1}{|}}{\overset{\frown}{N}} C=CH-\underset{\underset{O}{\|}}{C}-R_2 \qquad (II)$$

where Z represents the non-metallic atoms necessary to complete a nitrogen-containing heterocyclic ring; $R_1$ is an alkyl group or a substituted alkyl group; $R_2$ is an alkyl group, an aryl group or a substituted aryl group; and (d) a dye precursor.

20 Claims, No Drawings

PHOTOSENSITIVE RESIN COMPOSITION

BACKGROUND OF THE INVENTION

1. Field of the Invention

This invention relates to a photosensitive resin composition, and more specifically, to a photosensitive resin composition which is cured by irradiation with actinic rays and provides visible contrast between the exposed and unexposed area.

2. Description of the Prior Art

Preferably a photosensitive material such as a photosensitive printing plate (also known as a presensitized plate and hereinafter abbreviated PS plate) or a photo resist is capable of providing a print-out image, or the exposed area can be visually distinguished prior to development. Take for example of the PS plate, it is often subjected to photo composing, step and repeat printing down, where the ability to provide a print-out image is very important because the inability to recognize the exposed portion makes it difficult to perform the subsequent exposures. Research Disclosure No. 157, pp. 50–54, May 1977 discloses a PS plate using a photosensitive resin composition which is able to provide a print-out image by use of a combination of a leuco dye and an organic azide compound. However, given the print-out effect, this PS plate has reduced sensitivity and, after storage, the plate gives only a dull print-out image.

Therefore, attempts have been made to provide a photosensitive resin composition with a print-out effect using the print-out compositions described in U.S. Pat. Nos. 3,106,466, 3,113,024, 3,121,633, 3,954,475, and 3,987,037. However, the resulting resin compositions either have low sensitivity or provided a dull print-out image after storage even when they have satisfactory sensitivity.

SUMMARY OF THE INVENTION

It is therefore one object of this invention to provide a photosensitive resin composition which provides a sharp contrast between the exposed and unexposed area.

It is another object of this invention to provide a photosensitive resin composition having both the print-out effect and adequate sensitivity.

It is a further object of this invention to provide a photosensitive composition which can be stored without losing its ability to form a sharp print-out image.

As a result of various studies directed to achieving these objects, a photosensitive resin composition comprising:

(a) a photopolymerizable or photocrosslinkable ethylenically unsaturated compound;

(b) a compound of the formula (I):

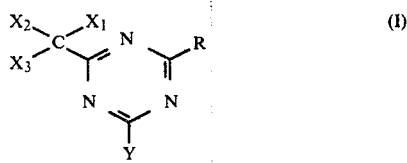

wherein $X_1$, $X_2$ and $X_3$ may be the same or different and each represents a hydrogen atom, a chlorine atom or a bromine atom, at least one of $X_1$, $X_2$ and $X_3$ representing a chlorine atom or a bromine atom; Y is

wherein $X_1$, $X_2$ and $X_3$ are as defined above, —NH$_2$, —NHR', —NR'$_2$, —SR', —OR' or —R' where R' is an alkyl group or an aryl group; R is an alkyl group, an aryl group or an alkenyl group, and may be substituted;

(c) a compound of the formula (II):

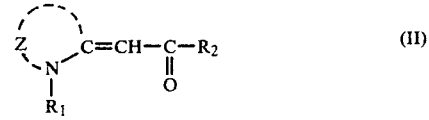

where Z represents the non-metallic atoms necessary to complete a nitrogen-containing heterocyclic nucleus; $R_1$ is an alkyl group or a substituted alkyl group; $R_2$ is an alkyl group, an aryl group or a substituted aryl group; and (d) a dye precursor has been discovered.

DETAILED DESCRIPTION OF THE INVENTION

The components of the photosensitive resin composition of this invention are described in detail below.

The photopolymerizable ethylenically unsaturated compound used as the component (a) is a generic description for compounds having in the molecule at least one addition-polymerizable ethylenically unsaturated double bond, and includes not only mono-, bi- and tri-functional monomers having one, two and three such double bonds, respectively, but also a polyfunctional oligomer having a weight average molecular weight not greater than about 10,000. Of these compounds, preferred is a compound having at least two ethylenic double bonds in the molecule, wherein at least one ethylenic double bond and preferably substantially all the ethylenic double bonds are conjugated with a carbon-carbon double bond or a carbon-hetero atom double bond where the hetero atom is such as oxygen, nitrogen or sulfur. A particularly effective ethylenic compound is one in which a polymerizable ethylenic double bond is conjugated with the carbonyl group of an ester or amide linkage. Examples of these ethylenic compounds are esters of the unsaturated carboxylic acids and aliphatic polyols which will be specified below and oligoester (or polyester) unsaturated carboxylates wherein oligoesters (or polyesters) of polyvalent carboxylic acids and aliphatic polyols form ester linkages with unsaturated carboxylic acids.

Specific examples of the unsaturated carboxylic acids are acrylic acid, methacrylic acid, itaconic acid, crotonic acid, isocrotonic acid, and maleic acid.

Examples of the above-described aliphatic polyol compounds include ethylene glycol, triethylene glycol, tetraethylene glycol, tetramethylene glycol, neopentyl glycol, 1,10-decane diol, trimethylol ethane, trimethylol propane, 1,2-butane diol, 1,3-butane diol, propylene glycol, pentaerythritol, dipentaerythritol, tripentaerythritol, sorbitol, d-mannitol, and dihydroxymaleic acid.

Specific examples of suitable ethylenic compounds are esters of acrylic acid or methacrylic acid and the polyols described in U.S. Pat. No. 2,927,022, British Pat. No. 875,378 and U.S. Pat. No. 3,486,903, such as diethylene glycol di(meth)acrylate, triethylene glycol di(meth)acrylate, trimethylol propane tri(meth)acrylate, pentaerythritol tri(meth)acrylate, pentaerythritol di(meth)acrylate, pentaerythritol tri(meth)acrylate; bisacrylamides such as methylenebisacrylamide, and xylylenebisacrylamide. Also suitable are the vinyl urethane compounds described in Japanese Patent Publication No. 41708/73 which have at least two polymerizable vinyl groups in one molecule and which are produced by addition of a hydroxyl group containing vinyl monomer of the formula (III) to a polyisocyanate compound having at least two isocyanate groups in one molecule:

$$CH_2{=}C(R_3)COOCH_2 \cdot CH(R_4)OH \qquad (III)$$

wherein $R_3$ and $R_4$ are each a hydrogen atom or methyl group.

Further, compounds represented by the following formula (IV), which are called polyester or oligoester (meth)acrylates and which are prepared by esterifying acrylic acid or methacrylic acid and one or more polybasic acids with one or more polyhydric alcohols are suitably used in the present invention;

$$(CH_2{=}\overset{R}{\underset{|}{C}}{-}\overset{O}{\underset{\|}{C}}{-}O{-})_nQ \qquad (IV)$$

wherein R represents a hydrogen atom or a methyl group, Q represents an ester group containing at least one ester bond composed of one or more polyhydric alcohols and one or more polybasic acids, and n is an integer of 1 to 6. Preferred polyhydric alcohols are aliphatic polyhydroxy compounds which contain from 2 to 30 carbon atoms, more preferably from 2 to 20 carbon atoms and have from 2 to 6 —OH groups, more preferably from 2 to 4 —OH groups. Good results are obtained utilizing such aliphatic polyhydroxy compounds having a molecular weight of from 60 to about 700, more preferably from 60 to about 500. Preferred polybasic acids have from 3 to 30 carbon atoms, more preferably from 4 to 20 carbon atoms (including the carboxylic carbon atom) and contain from 2 to 6 COOH groups, more preferably from 4 —COOH groups. Such polybasic acids have a molecular weight of from 104 to about 600, with excellent results being obtained using polybasic acids having a molecular weight of from 116 to about 500. Examples of these polyester (meth)acrylates are disclosed in U.S. Pat. No. 4,050,936. See Cols. 10 and 11 in particular.

Other useful compounds having at least two polymerizable ethylenically unsaturated groups in one molecule are the polyester poly(meth)acrylates and epoxy (meth)acrylates described in U.S. Pat. No. 3,732,107 and Japanese Patent Application (OPI) Nos. 32003/73 (The term "OPI" as used herein refers to a "published unexamined Japanese patent application") and No. 30504/73.

Examples of photocrosslinkable ethylenic unsaturated compounds which are also included in the component (a) include polyesters, polyamides, and polycarbonates containing a

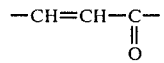
$$-CH{=}CH{-}\overset{\|}{\underset{O}{C}}{-}$$

linkage. Examples of such polymers are a photosensitive polymers containing the photosensitive group in the polymer main chain such as is described in U.S. Pat. Nos. 3,030,208 and 3,707,373, for instance, a photosensitive polyester comprising p-phenylene diacrylic acid and a diol; a photosensitive polymer of the type described in U.S. Pat. Nos. 2,956,878 and 3,173,787, for instance, a photosensitive polyester derived from a 2-properidene malonic acid compound such as cinnamylidenemalonic acid and a bifunctional glycol; a photosensitive polymer of the type described in U.S. Pat. Nos. 2,690,966, 2,753,372 and 2,732,301, for example, a cinnamate ester of a hydroxyl group containing a polymer such as polyvinyl alcohol, starch, cellulose or the like.

Component (b) generates a free radical, i.e., a halogen radical upon irradiation with actinic light which in turn is wholly or partially converted to a halogen acid. The compound of the formula (I) used as the component (b) is described below.

The substituent R' in the formula (I) is preferably a straight or branched chain alkyl group having 1 to 6 carbon atoms, such as a methyl group, an ethyl group, a propyl group, a butyl group, a t-butyl group, a pentyl group and an n-hexyl group; or a phenyl group.

Representative alkyl groups R are straight and branched chain alkyl groups having 1 to about 10 carbon atoms such as a methyl, ethyl, propyl, isopropyl, butyl, t-butyl, hexyl, nonyl and decyl groups, which alkyl groups may be substituted with a halogen atom such as a chlorine atom or a bromine atom. Representative aryl groups R include aryl groups having 1 to 3 (condensed) rings such as a phenyl group, a furyl group, a naphthyl group and an anthryl group. These aryl groups may be substituted with an alkyl group having 1 to 10 carbon atoms (e.g., methyl, ethyl, propyl and butyl groups), an alkoxy group having 1 to 10 carbon atoms (e.g., methoxy, ethoxy and propoxy groups), a halogen atom (e.g., chlorine atom, bromine atom), a nitro group, a cyano group and a dialkylamino group (the alkyl group of which has 1 to about 10 carbon atoms.

Representative alkenyl groups R are of the formula $-(CH{=}CH)_{\overline{n}}W$ wherein n is an integer of 1 to 3 and W is an aromatic nucleus (e.g., a phenyl group) or a heterocyclic nucleus (a heterocyclic nucleus such as a benzoxazole nucleus or benzothiazole nucleus which is contained in a cyanine dye is preferred), which nucleus may be substituted with a halogen atom (e.g., chlorine atom or bromine atom), a phenyl group, an alkyl group having 1 to 6 carbon atoms, a nitro group, an alkoxy group having 1 to 6 carbon atoms, an acetoxy group, an acetyl group, or an alkylamino group having 1 to 6 carbon atoms.

A particularly preferred compound of the formula (I) is one in which Y is

$$-\overset{X_1}{\underset{X_3}{\overset{|}{\underset{|}{C}}}}{-}X_2$$

wherein $X_1$, $X_2$ and $X_3$ are each a chlorine atom or a bromine atom, and R is an aryl group which may be substituted or an alkenyl group which may be substituted.

The compounds of the formula (I) are described in, for example, *Bulletin of Chemical Society of Japan*, Vol.

42, ff. 2924, 1969, *The Journal of Organic Chemistry*, Vol. 29, ff. 1527, 1964, and U.S. Pat. No. 3,954,475, or may be readily synthesized by those skilled in the art in accordance with the methods described in these prior art references.

Specific examples of the compound of the formula (I) employed in this invention are 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(-trichloromethyl)-s-triazine, 2-(2′,4′-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis-(trichloromethyl)-s-triazine, 2-($\alpha,\alpha,\beta$-trichloroethyl)-4,6-bis(trichloromethyl)-s-triazine, 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, 2-(p-methoxystyryl)-4-amino-6-trichloromethyl-s-triazine, 2-ethylthio-4,6-bis(trichloromethyl)-s-triazine, 2-methyl-4,6-bis(tribromomethyl)-s-triazine, 2,4,6-tris(dibromomethyl)-s-triazine, 2-amino-4-methyl-6-tribromomethyl-s-triazine, 2-methoxy-4-methyl-6-trichloromethyl-s-triazine, etc.

The compound (component (c)) of the formula (II) used in this invention is described in U.S. Pat. No. 3,870,524. $R_1$ is a straight chain alkyl group as is conventional in cyanine dyes having 1 to 10 carbon atoms and most preferably 1 to 5 carbon atoms (e.g., a methyl group, an ethyl group, a propyl group). $R_1$ includes a substituted alkyl group in which the alkyl moiety has 1 to 10 and preferably 1 to 5 carbon atoms such as a hydroxyalkyl group, an alkoxyalkyl group, a sulfoalkyl group, and an aralkyl group where the aryl moiety comprises preferably a benzene ring and the alkyl moiety comprises a polymethylene group of 1 to 10 and preferably 1 to 8 carbon atoms (e.g., a 2-hydroxyethyl group, a 2-methoxyethyl group, a carboxymethyl group, a 2-carboxyethyl group, a 3-carboxypropyl group, a 2-sulfoethyl group, a 3-sulfopropyl group, a 2-carbomethoxyethyl group, a benzyl group, a phenethyl group, a p-sulfophenethyl group, a p-carboxyphenethyl group, a vinyl methyl group, etc.). $R_2$ is an alkyl group generally having 1 to 10 and preferably 1 to 5 carbon atoms (e.g., a methyl group, an ethyl group and a propyl group), an aryl group where preferred aryl groups have 6 to 15 and most preferably 6 to 12 carbon atoms and comprises 1 or 2 (condensed) aromatic rings (e.g., a phenyl group, a naphthyl group, a thienyl group), or a substituted aryl group (e.g., a p-hydroxyphenyl group, a p-methoxyphenyl group, a p-chlorophenyl group). Z is a group of non-metallic atoms necessary to complete a nitrogen-containing heterocyclic nucleus generally used in a cyanine dye, for example, a benzothiazole (such as benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole, 5,6-dimethoxybenzothiazole), a naphthothiazole (such as $\alpha$-naphthothiazole or $\beta$-naphthothiazole), a benzoselenazole (such as benzoselenazole, 5-chlorobenzoselenazole, 6-methylbenzoselenazole, 6-methoxy benzoselenazole), a naphthoselenazole (such as $\alpha$-naphthoselenazole or $\beta$-naphthoselenazole), a benzoxazole (such as benzoxazole, 5-methylbenzoxazole, 5-phenylbenzoxazole, 6-methoxybenzoxazole), and a naphthoxazole (such as $\alpha$-naphthoxazole or $\beta$-naphthoxazole).

Specific examples of the compound of the formula (II) include 2-benzoylmethylene-3-methyl-$\beta$-naphthothiazoline, 2-benzoylmethylene-3-ethyl-$\beta$-naphthothiazoline, 3-ethyl-2-(2-thenoyl)methylene-$\beta$-naphthothiazoline, 3-ethyl-2-propionylmethylene-$\beta$-naphthothiazoline, 5-chloro-3-ethyl-2-p-methoxybenzoylmethylenebenzothiazoline, 2-benzoylmethylene-3-ethylbenzoselenazoline, 2-benzoyl-3-ethyl-$\alpha$-naphthothiazoline, and 2-benzoyl-3-(2-methoxyethyl)benzothiazoline.

The dye precursor used as the component (d) in this invention includes one which reacts with a free radical to produce a dye, hence a color and one which reacts with an acid to produce a dye, hence a color. A dye precursor which reacts with a free radical to produce a color is an arylamine. Suitable arylamines include not only simple arylamines such as primary and secondary aromatic amines but also what is referred to as a leuco dye which is exemplified by the following: diphenylamine, dibenzylamine, triphenylamine, diethylaniline, diphenyl-p-phenylenediamine, p-toluidine, 4,4′-biphenyldiamine, o-chloroaniline, o-bromoaniline, 4-chloro-o-phenylenediamine, o-bromo-N,N-dimethylaniline, 1,2,3-triphenylguanidine, naphthylamine, diaminodiphenylmethane, aniline, 2,5-dichloroaniline, N-methyldiphenylamine, o-toluidine, p,p′-tetramethyldiaminodiphenylmethane, N,N-dimethyl-p-phenylenediamine, 1,2-dianilinoethylene, p,p′,p″-hexamethyltriaminotriphenylmethane, p,p′-tetramethyldiaminotriphenylmethane, p,p′-tetramethyldiaminodiphenylmethylimine, p,p′,p″-triamino-o-methyltriphenylmethane, p,p′,p″-triaminotriphenylcarbinol, p,p′-tetramethylaminodiphenyl-4-anilinonaphthylmethane, p,p′,p″-triaminotriphenylmethane and p,p′,p″-hexapropyltriaminotriphenylmethane.

Examples of the dye precursor which reacts with an acid to produce a color include the compounds described in U.S. Pat. No. 3,669,658 and British Pat. No. 1,356,086. More specific examples are leuco dyes such as 4,4′-tetramethyldiaminodiphenylmethane, Michler's hydrol, Michler's hydrol methyl ether, bis(4,4′-bisdimethylaminobenzhydryl)ether, 4,4′-tetramethyldiaminodiphenyl methyl benzoate, tetramethylbenzidine, crystal violet lactone, crystal violet carbinol base, crystal violet carbinol ethyl ether, malachite green carbinol base, malachite green lactone, malachite green carbinol ethyl ether, primocyanine carbinol base, primocyanine carbinol methyl ehter, rhodamine B anilinolactam, primocyanine carbinol ethyl ether, spirit sky blue carbinol base, spirit sky blue carbinol methyl ether, spirit sky blue carbinol ethyl ether, N-phenyl leuco auramine, and N-(p-chlorophenyl) lauco auramine.

Desirably, a small amount of thermopolymerization inhibitor is added to the composition to prevent unwanted thermal polymerization of the ethylenic unsaturated compound in this invention. Suitable thermopolymerization inhibitors are hydroquinone, p-methoxyphenol, di-t-butyl-p-cresol, pyrogallol, t-butyl catechol, benzoquinone, 4,4′-thiobis(3-methyl-6-t-butylphenol), 2,2′-methylenebis(4-methyl-6-t-butylphenol), 2-mercaptobenzoimidazole and N-nitrosophenylhydroxylamine cerous salt.

If a leuco triphenyl methane type dye is used as the dye precursor in this invention, it is effective to incorporate a certain kind of stabilizer because the dye is slightly oxidized to produce a color. Stabilizers that can effectively be used for this purpose include the amines, zinc oxide and phenols described in U.S. Pat. No. 3,042,575, the sulfur compounds described in U.S. Pat. No. 3,042,516, the iodides of alkali metals and organic acids described in U.S. Pat. No. 3,042,518, the organic acid anhydrides described in U.S. Pat. No. 3,082,086, and the triaryl compounds of antimony, arsenic, bismuth and phosphorus described in U.S. Pat. No. 3,377,167.

It is to be understood that various additives may be used in this invention, for example, a dye or pigment for coloring, and an inorganic filler, a film forming resin or plasticizer for improving the physical properties of the hardened coating.

To use the photosensitive resin composition of this invention in practice, its components described herein are dissolved in solvent and coated on a suitable support by a conventional method. The following table shows both a preferred proportion of these components and a particularly preferred proportion thereof in terms of parts by weight based on 100 parts by weight of the photosensitive compound (photopolymerizable or photocrosslinkable ethylenically unsaturated compound).

|  | Preferred Range (parts) | Particularly Preferred Range (parts) |
|---|---|---|
| Free radical forming agent (b) of formula (I) | 0.01 to 100 | 0.1 tp 50 |
| Sensitizer (c) of formula (II) | 0.01 to 50 | 0.05 to 20 |
| Dye precursor (d) | 0.1 to 50 | 1 to 10 |
| Plasticizer | 0 to 1,000 | 0 to 50 |
| Resin | 0 to 5,000 | 0 to 1,000 |
| Dye or pigment other than the dye precursor | 0 to 100 | 0 to 50 |
| Thermopolymerization inhibitor | 0 to 50 | 0 to 20 |

Examples of the solvent for application of the photosensitive resin composition of this invention are ethylene dichloride, cyclohexanone, methyl ethyl ketone, methyl cellosolve acetate, monochlorobenzene, toluene, ethyl acetate, and dimethylformamide. These solvents may be used independently or as a mixture. The photosensitive resin composition of this invention is generally used in the form of a layerwise coating on a suitable support. The composition of this invention is used with particular advantage as a photosensitive layer for a PS plate. For making a photosensitive lithographic printing plate, the coating weight of the composition is generally in the range of from 0.1 to 10.0 g/m$^2$, preferably from 0.5 to 5.0 g/m$^2$ for a solid content.

The resin composition of the present invention is sensitive to an ordinary U.V. light source such as a metal halide lamp, etc.

This invention will hereunder be described in greater detail by reference to the following Examples and Comparative Examples which are given here for illustrative purposes only and are by no means intended to limit the scope of this invention.

EXAMPLE 1

According to the method disclosed in the Examples of Japanese Patent Application (OPI) No. 33911/73, an aluminum plate was grained with a nylon brush, anodized, coated with a sensitizing solution of the formulation below using a whirler, and dried at 100° C. for 2 minutes to prepare a negative type PS plate. The coating weight on a dry basis was about 2.0 g/m$^2$.

| | |
|---|---|
| Polyester synthesized by condensation of ethyl p-phenylene diacrylate and an equimolar amount of 1,4-di-β-hydroxyethoxycyclohexane (weight average molecular weight of about 8,000) | 2.3 g |
| 2-Benzoylmethylene-3-methyl-β-naphthothiazoline (a compound of the formula (II)) | 0.01 g |
| Free radical forming agent (compound of formula (I), specified in Table 1) | 0.008 g |
| Leuco crystal violet | 0.1 g |
| Hydroquinone | 0.01 g |
| Ethylene dichloride | 6 g |
| Monochloroenzene | 9 g |

Each of the thus-prepared PS plates was set in a vacuum printing frame and exposed for a period of 40 seconds to a PS light type S (a 2 kw metal halide lamp manufactured by Fuji Photo Film Co., Ltd.) placed 1 m away. A Macbeth reflection densitometer was used to measure the optical densities of the photosensitive layer both at the exposed and unexposed areas which varied depending upon the kind of free radical forming agents used. A greater difference in density (ΔD) between the exposed area and unexposed area indicates a sharper exposed image was produced. The results are given in Table 1. Table 1 also shows the results of comparative examples wherein the same procedure as above was repeated except that the sensitizing solution did not contain 2-benzoylmethylene-3-methyl-β-naphthothiazoline.

Table 1 clearly shows that use of both the free radical forming agent of the formula (I) and 2-benzoylmethylene-3-methyl-β-naphthothiazoline provided a print-out image with a sharper contrast than when the respective agents were used independently. The decrease in sensitivity resulting from the addition of the free radical forming agent of the formula (I) and leuco crystal violet, namely, the decrease in sensitivity at the cost of forming a print-out image, was negligible.

TABLE 1

| Run No. | Compound of Formula (I) | 2-Benzoylmethylene-1-methyl-β-naphthothiazoline | Density Exposed Area | Density Unexposed Area | ΔD |
|---|---|---|---|---|---|
| 1 | | Present | 0.38 | 0.34 | 0.04 |
| 1' | Absent | Absent | 0.34 | 0.34 | 0 |

TABLE 1-continued

| Run No. | Compound of Formula (I) | 2-Benzoylmethylene-1-methyl-β-naphthothiazoline | Density Exposed Area | Density Unexposed Area | ΔD |
|---|---|---|---|---|---|
| 2 | CCl₃ triazine with CH=CH–C₆H₄–OCH₃ substituent | Present | 0.64 | 0.36 | 0.28 |
| 2' | | Absent | 0.49 | 0.33 | 0.16 |
| 3 | CCl₃ triazine with C₆H₄–OCH₃ (para-methoxyphenyl) | Present | 0.65 | 0.35 | 0.30 |
| 3' | | Absent | 0.46 | 0.33 | 0.13 |
| 4 | CCl₃ triazine with phenyl | Present | 0.64 | 0.36 | 0.28 |
| 4' | | Absent | 0.49 | 0.34 | 0.15 |
| 5 | CCl₃ triazine with p-chlorophenyl | Present | 0.64 | 0.35 | 0.29 |
| 5' | | Absent | 0.50 | 0.33 | 0.17 |
| 6 | CCl₃ triazine with p-tolyl (CH₃) | Present | 0.65 | 0.36 | 0.29 |
| 6' | | Absent | 0.47 | 0.33 | 0.14 |
| 7 | CCl₃ triazine with methylenedioxyphenyl | Present | 0.67 | 0.37 | 0.30 |
| 7' | | Absent | 0.47 | 0.33 | 0.14 |
| 8 | bis-CCl₃ triazine | Present | 0.64 | 0.38 | 0.26 |
| 8' | | Absent | 0.35 | 0.33 | 0.02 |
| 9 | CCl₃ triazine with CH₃ | Present | 0.61 | 0.36 | 0.25 |
| 9' | | Absent | 0.36 | 0.33 | 0.03 |
| 10 | CCl₃ triazine with SC₂H₅ | Present | 0.63 | 0.37 | 0.26 |
| 10' | | Absent | 0.36 | 0.34 | 0.02 |

EXAMPLE 2

The aluminum support used in Example 1 was coated with a sensitizing solution of the following formulation using the same method as Example 1. The coating weight on a dry basis was about 2.0 g/m².

| | |
|---|---|
| Polyester synthesized by condensation of ethyl p-phenylene diacrylate and an equimolar amount of 1,4-di-β-hydroxyethoxycyclohexane (weight average molecular weight of about 8,000) | 2.3 g |

| -continued | |
|---|---|
| 2-Benzoylmethylene-3-methyl-β-naphthothiazoline | 0.01 g |
| Free radical forming agent (specified in Table 2) | 0.008 g |
| Leuco crystal violet | 0.1 g |
| Hydroquinone | 0.01 g |
| Ethylene dichloride | 6 g |
| Monochlorobenzene | 9 g |

Each of the resulting PS plates were exposed under the same conditions as Example 1 and the difference in density (ΔD) between the exposed and the unexposed areas was measured. Another measurement of ΔD was performed after each PS plate was subjected to forced ageing and subsequently exposed under the same conditions as above. Forced ageing was conducted at 60° C., 75% RH for 7 days. Table 2 shows the results using different kinds of the free radical forming agent. The table also includes the results of a comparative example wherein carbon tetrabromide was used as the free radical forming agent.

TABLE 2

| Compound of Formula (I) | ΔD | ΔD after Aging |
|---|---|---|
| 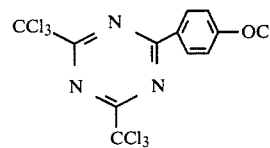 | 0.30 | 0.25 |
| 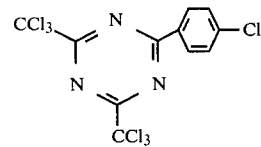 | 0.29 | 0.25 |
| 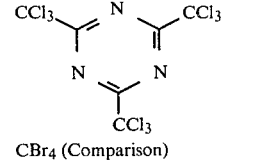 | 0.26 | 0.23 |
| CBr₄ (Comparison) | 0.08 | 0.01 |

Table 2 shows that the photosensitive resin composition of this invention has high stability against ageing. The PS plate of the comparative example produced only a dull print-out image and its stability against ageing was low.

EXAMPLE 3

PS plates were prepared by repeating the procedure of Example 1 except that a sensitizing solution of the following formulation was used.

| | |
|---|---|
| Methyl methacrylate methacrylic acid (molar ratio: 85/15) copolymer (intrinsic viscosity of 0.166 in methyl ethyl ketone at 30° C.) | 48 g |
| Trimethylol propane triacrylate | 29 g |
| Compound of formula (I) (as specified in Tables 3 and 5) | 2.7 g |
| Compound of formula (II) (as specified in Tables 4 and 5) | 1.9 g |
| Leuco malachite green | 1 g |
| Triphenyl phosphate | 8 g |
| Hydroquinone | 0.5 g |
| Ethyl cellosolve | 50 ml |

| -continued | |
|---|---|
| Methylene chloride | 40 ml |

Each of the thus prepared PS plates was exposed with a plano PS printer A 3 (a product of Fuji Photo Film Co., Ltd.) for a period of 2 minutes. The procedure of Example 1 was repeated for measuring the difference in density ΔD between the exposed and unexposed areas. After exposure with a step wedge having a difference in density of 0.15, each plate was developed with a developing solution of the following formulation and checked for its sensitivity.

| Developing Solution | |
|---|---|
| Trisodium phosphate | 25 g |
| Monosodium phosphate | 5 g |
| Butyl cellosolve | 70 g |
| Surfactant | 2 ml |
| Water | 1 l |

The compounds of the formulae (I) and (II) employed in Example 3 are listed in Tables 3 and 4. The differences in density (ΔD) between the exposed and unexposed areas and sensitivities as compared between independent use of a compound of the formula (I) or (II) and use of both compounds are set forth in Table 5.

The sensitivities in Table 1 are relative to the sensitivity obtained by independent use of a compound (II)-1 which is taken as 1.0.

TABLE 3

| | Compounds of Formula (I) |
|---|---|
| Compound No. | Structural Formula |
| I-1 | 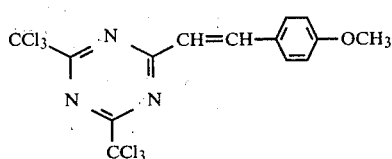 |
| I-2 | 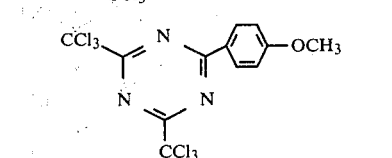 |
| I-3 | 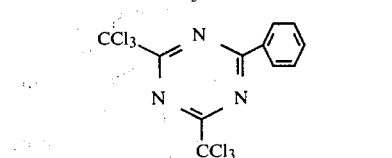 |
| I-4 | 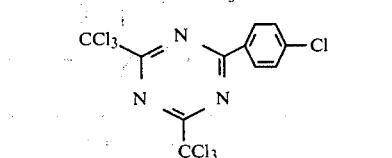 |
| I-5 | 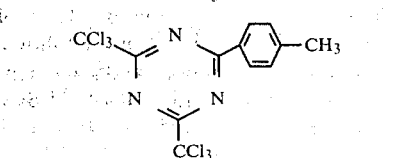 |

TABLE 3-continued

Compounds of Formula (I)

| Compound No. | Structural Formula |
|---|---|
| I-6 | 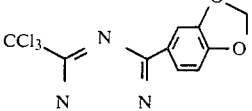 |
| I-7 | 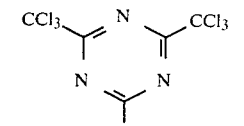 |
| I-8 | 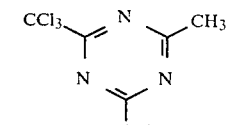 |

TABLE 4

Compounds of Formula (II)

| Compound No. | Structural Formula |
|---|---|
| II-1 | 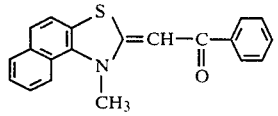 |
| II-2 | 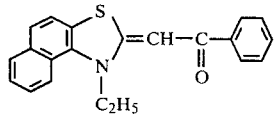 |
| II-3 | 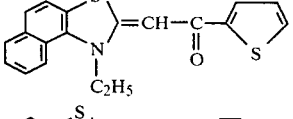 |
| II-4 | 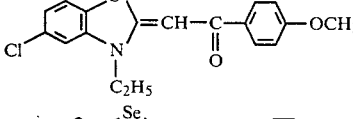 |
| II-5 | 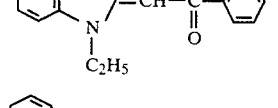 |
| II-6 | 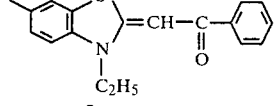 |
| II-7 | 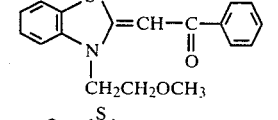 |
| II-8 | 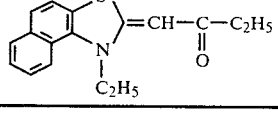 |

TABLE 5

Sharpness of print-out image and sensitivity as compared between the use of a compound of formula (I) or (II) alone and use of both compounds together

| No. | I | II | ΔD | Sensitivity |
|---|---|---|---|---|
| 1 |  | II-1 | 0.04 | 1 |
| 2 |  | II-2 | 0.04 | 2 |
| 3 |  | II-3 | 0.04 | 0 |
| 4 |  | II-4 | 0.03 | 0 |
| 5 |  | II-5 | 0.03 | 0 |
| 6 |  | II-6 | 0.04 | 0 |
| 7 |  | II-7 | 0.05 | 0 |
| 8 |  | II-8 | 0.03 | 0 |
| 9 | I-1 |  | 0.12 | 4 |
| 10 | I-2 |  | 0.10 | 0.7 |
| 11 | I-3 |  | 0.12 | 0 |
| 12 | I-4 |  | 0.13 | 0 |
| 13 | I-5 |  | 0.10 | 0 |
| 14 | I-6 |  | 0.10 | 1.4 |
| 15 | I-7 |  | 0.02 | 0 |
| 16 | I-8 |  | 0.02 | 0 |
| 17 | I-1 | II-1 | 0.25 | 15 |
| 18 | I-2 | " | 0.26 | 15 |
| 19 | I-3 | " | 0.24 | 15 |
| 20 | I-4 | " | 0.25 | 15 |
| 21 | I-5 | " | 0.25 | 17 |
| 22 | I-6 | II-1 | 0.27 | 22 |
| 23 | I-7 | " | 0.22 | 30 |
| 24 | I-8 | " | 0.22 | 22 |
| 25 | I-6 | II-2 | 0.27 | 22 |
| 26 | " | II-3 | 0.26 | 21 |
| 27 | " | II-4 | 0.25 | 15 |
| 28 | " | II-5 | 0.23 | 15 |
| 29 | " | II-6 | 0.24 | 15 |
| 30 | " | II-7 | 0.28 | 7 |
| 31 | " | II-8 | 0.25 | 5 |
| 32 | I-7 | II-2 | 0.22 | 30 |
| 33 | " | II-3 | 0.21 | 23 |
| 34 | " | II-4 | 0.23 | 16 |
| 35 | " | II-5 | 0.20 | 15 |
| 36 | " | II-6 | 0.19 | 15 |
| 37 | " | II-7 | 0.24 | 8 |
| 38 | " | II-8 | 0.21 | 6 |

As Table 5 clearly shows, the combination of compound (I) and compound (II) provided a print-out image by far sharper than when each compound was used independently. It is also clear that the same combination helped increase remarkably the sensitivity of the photopolymerizable sensitive composition.

EXAMPLE 4

An aluminum plate was treated in a sequence of the steps of graining, anodization in aqueous sulfuric acid and subbing with a water-soluble resin as disclosed in Example 1 of British Pat. No. 1,530,410 and thereafter it was coated with a sensitizing solution of the following formulation using a whirler.

| | |
|---|---|
| Polyethylene chloride (available from Sanyo Kokusaku Pulp Co., Ltd. under the trade name Superchron, CPE-907 LTA; a viscosity of about 90 cps in 40 wt% toluene at 25° C. a chlorine content more than 66 wt%) | 6.67 g |
| Pentaerythritol trimethacrylate | 10 g |
| Hydroquinone monomethyl ether | 0.01 g |
| Copper phthalocyanine pigment | 0.21 g |
|  | 0.3 g |

-continued

|  |  |
|---|---|
| ![structure: CCl3-C(=N-)-N=C(CCl3)-N=C(-)-C6H4-OCH3 triazine] | 0.3 g |
| Leuco crystal violet | 0.2 g |
| Methyl ethyl ketone | 100 ml |
| Dimethylformamide | 20 ml |

The plate was dried at 120° C. for 2 minutes. The coating weight on a dry basis was about 4 g/m². The photosensitive layer with which the aluminum plate was coated was laminated under pressure with a polyethylene terephthalate film 25 μm thick. A negative transparent film was placed on the polyethylene terephthalate film in contact relationship, and the resulting photosensitive plate was exposed for a period of 7 seconds with the sensitizing machine used in Example 1. The result was a sharp print-out image having a difference in density of 0.20 between the exposed area and unexposed area. When the polyethylene terephthalate film was peeled off the aluminum plate, a photoset positive image was provided on the plate. The resulting lithographic printing plate was set on a printing machine, and beautiful stainless printed matter was obtained.

The photosensitive aluminum plate laminated under pressure with the 25 μm thick polyethylene terephthalate film was stored in a dark room at a temperature of 60° C. and a humidity of 75% for a period of 7 days exposed as described above, had the polyethylene terephthalate film peeled off, and set on a printing machine. The print-out image was sharp, and the printed matter was beautiful and without stain.

EXAMPLE 5

The aluminum plate used in Example 1 was coated with a sensitizing solution of the following formulation according to the same manner as Example 1. The coating weight on a dry basis was about 2.0 g/m².

| | |
|---|---|
| Polyester synthesized by condensation of ethyl p-phenylene diacrylate and an equimolar amount of 1,4-di-β-hydroxyethoxycyclohexane (average molecular weight of about 8,000) | 2.3 g |
| 2-Benzoylmethylene-3-methyl-β-naphthothiazoline | 0.01 g |
| 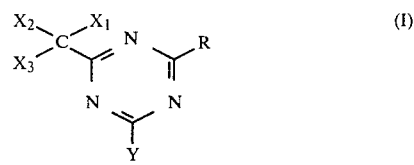 | 0.008 g |
| 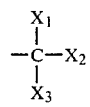 | 0.03 g |
| Copper phthalocyanine | 0.06 g |
| Dibutyl phthalate | 0.4 g |
| Ethylene dichloride | 6 g |
| Monochlorobenzene | 9 g |

A negative film was placed on the plate in contact relationship, and the resulting photosensitive plate was exposed under the same conditions of Example 1 to provide a sharp print-out image. Printing after development with a developing solution of the following formulation produced beautiful stainless printed matter.

| Developing Solution | |
|---|---|
| Benzyl alcohol | 20 g |
| Sodium hydroxide | 2 g |
| Surfactant | 1 g |
| Water | 1 l |

A printing plate was prepared repeating the above procedure except that the sensitizing solution did not contain a free radical forming agent or a dye precursor. The plate did not provide a print-out image but its sensitivity and durability were equal to the plate prepared according to this invention and produced beautiful printed matter. Therefore, the photosensitive resin composition of this invention successfully provided a print-out image without reducing its performance as a printing plate.

While the invention has been described in detail and with reference to specific embodiments thereof, it will be apparent to one skilled in the art that various changes and modifications can be made therein without departing from the spirit and scope thereof.

What is claimed is:
1. A photosensitive resin composition comprising:
(a) a photopolymerizable or photocrosslinkable ethylenic unsaturated compound;
(b) a compound of the formula (I):

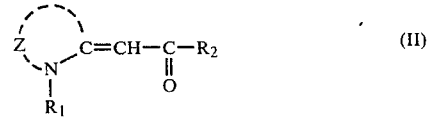

wherein $X_1$, $X_2$ and $X_3$ may be the same or different and each represents a hydrogen atom, a chlorine atom or a bromine atom, at least one of $X_1$, $X_2$ and $X_3$ representing a chlorine atom or a bromine atom; Y is $$-\underset{\underset{X_3}{|}}{\overset{\overset{X_1}{|}}{C}}-X_2$$

wherein $X_1$, $X_2$ and $X_3$ are as defined above, $-NH_2$, $-NHR'$, $-NR'_2$, $-SR'$, $-OR'$ or $-R'$ where $R'$ is an alkyl group or an aryl group; R is an alkyl group, an aryl group or an alkenyl group and R may be substituted;
(c) a compound of the formula (II):

$$\underset{\underset{R_1}{|}}{\overset{\overset{\frown}{Z}}{\underset{N}{\diagdown}}}C=CH-\underset{\underset{O}{\parallel}}{C}-R_2 \qquad (II)$$

where Z represents the non-metallic atoms necessary for completing a nitrogen-containing heterocyclic nucleus; $R_1$ is an alkyl group or a substituted alkyl group, $R_2$ is an alkyl group, an aryl group or a substituted aryl group; and (d) a dye precursor.

2. The resin composition of claim 1, wherein Y is a $-CX_1X_2X_3$ group and $X_1$, $X_2$ and $X_3$; L represent a chlorine or bromine atom and R represents an aryl group, a substituted aryl group or an alkenyl group.

3. The resin composition of claim 2, wherein said alkenyl group is represented by the formula:

where W represents an aromatic or a heterocyclic nucleus and n is an integer from 1 to 3.

4. The resin composition of claim 1, wherein said compound of the formula (II) is 2-benzoylmethylene-3-methyl-β-naphthothiazoline, 2-benzoylmethylene-3-ethyl-β-naphthothiazoline, 3-ethyl-2-(2-thenoyl)methylene-β-naphthothiazoline, 3-ethyl-2-propionylmethylene-β-naphthothiazoline, 5-chloro-3-ethyl-2-p-methoxybenzoylmethylenebenzothiazoline, 2-benzoylmethylene-3-ethylbenzoselenazoline, 2-benzoyl-3-ethyl-α-naphthothiazoline, or 2-benzoyl-3-(2-methoxyethyl)-benzothiazoline.

5. The resin composition of claim 1, wherein said ethylenic unsaturation is conjugated with another carbon-to-carbon or carbon-to-hetero atom double bond.

6. The resin composition of claim 1, wherein component (a) is an ester of an unsaturated carboxylic acid and an aliphatic polyol, an oligoester unsaturated carboxylate, or a vinyl urethane compound.

7. The resin composition of claim 6, wherein said unsaturated carboxylic acid is selected from the group consisting of acrylic acid, methacrylic acid, itaconic acid, crotonic acid, isocrotonic acid and maleic acid.

8. The resin composition of claim 7, wherein said unsaturated carboxylic acid is acrylic acid or methacrylic acid.

9. The resin composition of claim 1, wherein said component (a) is a photosensitive polyester, polyamide or polycarbonate containing a

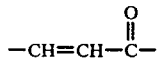

linkage.

10. The resin composition of claim 1, wherein said dye precursor is an arylamine or a leuco dye.

11. The resin composition of claim 11, wherein said arylamine is selected from the group consisting of diphenylamine, dibenzylamine, triphenylamine, diethylaniline, diphenyl-p-phenylenediamine, p-toluidine, 4,4'-biphenyldiamine, o-chloroaniline, o-bromoaniline, 4-chloro-o-phenylenediamine, o-bromo-N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p''-hexamethyltriaminotriphenylmethane, p,p'-tetramethyldiaminotriphenylmethane, p,p'-tetramethyldiaminodiphenylmethylimine, p,p',p''-triamino-o-methyltriphenylmethane, p,p',p''-triaminotriphenylcarbinol, p,p'-tetramethylaminodiphenyl-4-anilinonaphthylmethane, p,p',p''-triaminotriphenylmethane and p,p',p''-hexapropyltriaminotriphenylmethane.

12. The resin composition of claim 11, wherein said dye precursor is a leuco dye selected from the group consisting of 4,4'-tetramethyldiaminodiphenylmethane, Michler's hydrol, Michler's hydrol methyl ether, bis(4,4'-bisdimethylaminobenzhydryl)ether, 4,4'-tetramethyldiaminodiphenyl methyl benzoate, tetramethylbenzidine, crystal violet lactone, crystal violet carbinol base, crystal violet carbinol ethyl ether, malachite green carbinol base, malachite green lactone, malachite green carbinol ethyl ether, primocyanine carbinol base, primocyanine carbinol methyl ehter, rhodamine B anilinolactam, primocyanine carbinol ethyl ether, spirit sky blue carbinol base, spirit sky blue carbinol methyl ehter, spirit sky blue carbinol ethyl ether, N-phenyl leuco auramine, and N-(p-chlorophenyl) lauco auramine.

13. The resin composition of claim 1, which additionally comprises a thermopolymerization inhibitor.

14. The resin composition of claim 1, wherein said compound of the formula (I) is present in an amount of about 0.01 to 100 parts by weight per 100 parts by weight of said component (a).

15. The resin composition of claim 1, wherein said compound of the formula (II) is present in an amount of about 0.01 to 50 parts by weight per 100 parts by weight of said component (a).

16. The resin composition of claim 1, wherein said dye precursor is present in an amount of about 0.1 to 50 parts by weight per 100 parts by weight of said component (a).

17. The resin composition of claim 1, wherein said composition additionally contains a plasticizer in an amount of about 0 to 100 parts by weight per 100 parts by weight of said component (a).

18. The resin composition of claim 1, wherein said compositiion additionally comprises a film-forming resin in an amount of about 0 to 5,000 parts by weight per 100 parts by weight of said component (a).

19. The resin composition of claim 14, wherein said thermopolymerization inhibitor is present in an amount of about 0 to 30 parts by weight per 100 parts by weight of said component (a).

20. A photosensitive printing plate-forming material comprising a support having coated thereon the resin composition of claim 1.

* * * * *